United States Patent
Huang

(10) Patent No.: US 11,552,184 B2
(45) Date of Patent: Jan. 10, 2023

(54) CARRIER STORAGE ENHANCED SUPERJUNCTION IGBT

(71) Applicant: SICHUAN UNIVERSITY, Sichuan (CN)

(72) Inventor: Mingmin Huang, Sichuan (CN)

(73) Assignee: SICHUAN UNIVERSITY, Chengdu (CN)

( * ) Notice: Subject to any disclaimer, the term of this patent is extended or adjusted under 35 U.S.C. 154(b) by 45 days.

(21) Appl. No.: 17/075,455

(22) Filed: Oct. 20, 2020

(65) Prior Publication Data

US 2021/0057554 A1 Feb. 25, 2021

Related U.S. Application Data

(63) Continuation of application No. PCT/CN2019/078723, filed on Mar. 19, 2019.

(30) Foreign Application Priority Data

Apr. 24, 2018 (CN) .......................... 201810371393.5

(51) Int. Cl.
*H01L 29/06* (2006.01)
*H01L 29/739* (2006.01)

(52) U.S. Cl.
CPC ...... *H01L 29/7394* (2013.01); *H01L 29/0634* (2013.01); *H01L 29/0696* (2013.01)

(58) Field of Classification Search
CPC . H01L 29/0696; H01L 29/08; H01L 29/0821; H01L 29/083; H01L 29/7397;
(Continued)

(56) References Cited

U.S. PATENT DOCUMENTS

| 7,737,491 B2* | 6/2010 | Hotta | H01L 29/0634 257/330 |
| 2008/0211020 A1* | 9/2008 | Saito | H01L 29/7811 257/342 |
| 2009/0283797 A1* | 11/2009 | Takahashi | H01L 29/7397 257/E29.198 |
| 2014/0077255 A1* | 3/2014 | Naijo | H01L 29/0634 257/773 |
| 2014/0124851 A1* | 5/2014 | Gamerith | H01L 29/0878 257/329 |

(Continued)

FOREIGN PATENT DOCUMENTS

| CN | 103956379 A | 7/2014 |
| CN | 106356400 A | 1/2017 |
| CN | 107195678 A | 9/2017 |
| CN | 107275381 A | 10/2017 |

(Continued)

OTHER PUBLICATIONS

Zhigui Li, Frank X.C.Jiang, Binghua Li, Xinnan Lin; A New Way to Break through the Limitation of CS-layer Doping on the Breakdown Voltage of CSTBT the superjunction solution; Oct. 25, 2013; Peking University Shenzhen Graduate School, Shenzhen, China.

*Primary Examiner* — Natalia A Gondarenko

(57) ABSTRACT

The disclosure provides a superjunction IGBT (insulated gate bipolar transistor) device, wherein a carrier storage layer of a first conductivity type is provided between a voltage sustaining layer and a base region, and a MISFET (metal-insulator-semiconductor field effect transistor) of a second conductivity type is also integrated in a cell, with at least one gate of the MISFET is connected to the emitter contact thereof. The MISFET is turned off at a low forward conduction voltage, helping to reduce the conduction voltage drop. The MISFET can provide a path for carriers of a second conductivity type and prevent the carrier storage layer from suffering a high electric field when the forward
(Continued)

conduction voltage is slightly higher or it is at the forward blocking state, helping to improve the reliability.

8 Claims, 10 Drawing Sheets

(58) Field of Classification Search
CPC ............ H01L 29/1095; H01L 29/0623; H01L 29/407; H01L 29/42304; H01L 29/42352; H01L 29/42356; H01L 29/4236; H01L 29/42364; H01L 29/66333; H01L 29/0619; H01L 29/7393; H01L 29/7395; H01L 29/7396; H01L 29/66234–66348; H01L 29/6348; H01L 29/7394; H01L 29/73–7378; H01L 29/739–7398; H01L 29/41708; H01L 29/41716; H01L 29/42376; H01L 29/4238; H01L 29/42368; H01L 2924/1305–13056; H01L 29/0634; H01L 29/0804–0834; H01L 29/1004; H01L 29/66318; H01L 29/66325; H01L 29/66265; H01L 29/66295–66303
USPC ................. 257/139, 330, 331, 586, 583, 510
See application file for complete search history.

(56) References Cited

U.S. PATENT DOCUMENTS

| | | | |
|---|---|---|---|
| 2015/0115355 A1* | 4/2015 | Hirler | ................ H01L 29/404 257/331 |
| 2018/0097069 A1* | 4/2018 | Utsumi | ............... H01L 29/1608 |

FOREIGN PATENT DOCUMENTS

| | | |
|---|---|---|
| CN | 107275383 A | 10/2017 |
| CN | 107293579 A | 10/2017 |
| CN | 108389901 A | 8/2018 |

* cited by examiner

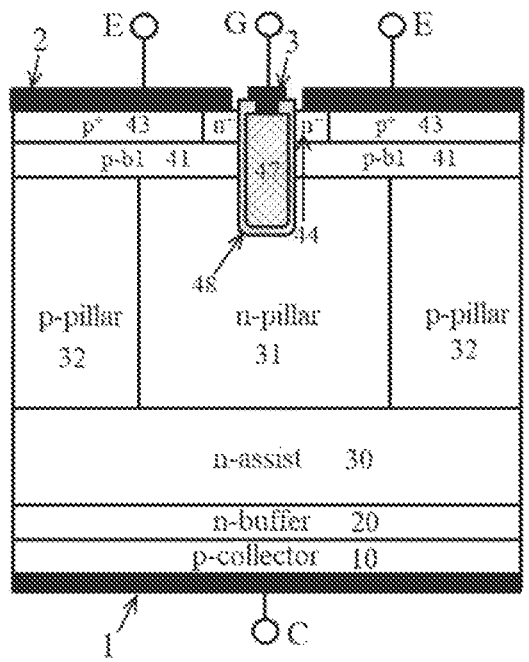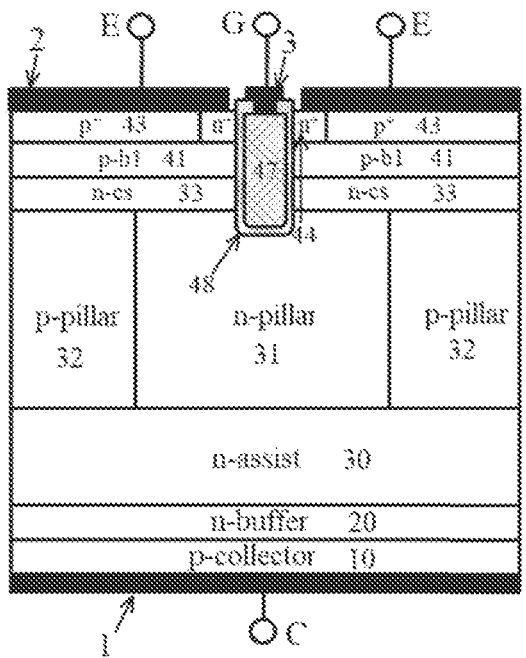
FIG.1(a)　　　　　　　　　FIG. 1(b)
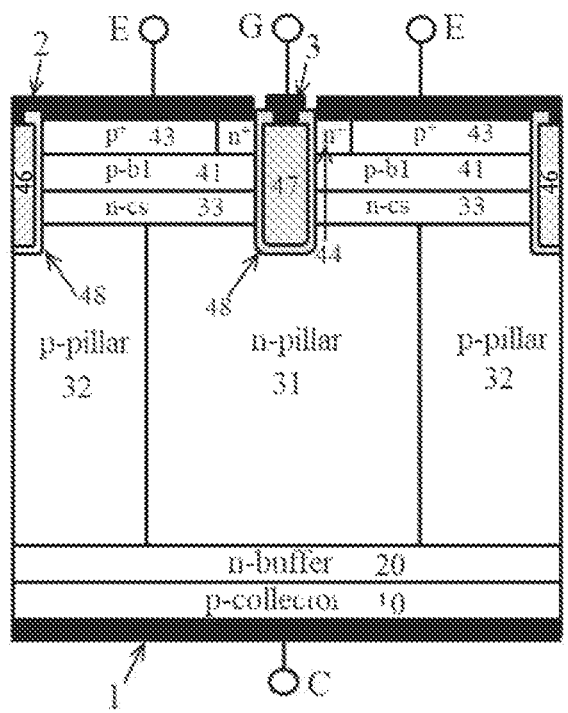
FIG. 2

US 11,552,184 B2

CARRIER STORAGE ENHANCED SUPERJUNCTION IGBT

CROSS-REFERENCE TO RELATED APPLICATIONS

This application is a continuation of International Patent Application No. PCT/CN2019/078723, filed on Mar. 19, 2019, which claims the benefit of priority from Chinese Patent Application No. 201810371393.5, filed on Apr. 24, 2018. The content of the aforementioned applications, including any intervening amendments thereto, is incorporated herein by reference.

TECHNICAL FIELD

The disclosure belongs to a semiconductor device, in particular a power semiconductor device.

BACKGROUND OF THE DISCLOSURE

Superjunction (SJ) is a voltage sustaining structure alternately arranged by an n-pillar/p-pillar, which enables the n-pillar and the p-pillar to still obtain a high breakdown voltage under a high doping concentration. When the superjunction is applied into an insulated gate bipolar transistor (IGBT) (ie, a superjunction IGBT), the n-pillar/p-pillar junction can be quickly exhausted during the turn-off process, so that the turn-off speed is increased (or the power consumption is reduced). However, in a common superjunction IGBT, holes injected into the n-pillar from the p-type collector region are easily collected by the p-pillar and enter the p-type base region, so that the storage effect of minority carriers in the body (especially at the top of the voltage sustaining region) is weak, and the conduction voltage drop is high. If the p-pillar in the superjunction IGBT is isolated from the p-type base region by an n region (ie, the p-pillar is floating), holes are difficult to enter the p-type base region from the p-pillar, the carrier storage effect in the body can be enhanced, and the conduction voltage drop is reduced. However, the n region introduced is prone to break down at the blocking state, and holes are always not fluent from the p-pillar into the p-type base region, which affects the reliability of the device.

SUMMARY OF THE DISCLOSURE

The aim of the disclosure is to provide a superjunction insulated gate bipolar transistor device. Compared to a common superjunction IGBT and a superjunction IGBT with a floating p-pillar, the superjunction IGBT device provided by the disclosure can enhance the storage effect of minority carriers in the body and meanwhile ensure a high breakdown voltage, reduce the conduction voltage drop, and provide a smooth path for holes in the p-pillar during the switching process.

The disclosure provides a superjunction insulated gate bipolar transistor device, a cell structure of the device comprising: a voltage sustaining layer (composed of 31 and 32), a collector structure (composed of 10 and 20) in contact with a bottom plane of the voltage sustaining layer (composed of 31 and 32), a base region (composed of 41 and 43, or composed of 41, 42, 43, and 45) of a second conductivity type in contact with a top plane of the voltage sustaining layer (composed of 31 and 32), a heavily doped emitter region 44 of a first conductivity type in contact with at least a portion of the base region (composed of 41 and 43, or composed of 41, 42, 43, and 45), a trench gate structure (composed of 47 and 48) configured for controlling on and off in contact with the emitter region 44, the base region (composed of 41 and 43, or composed of 41, 42, 43, and 45) and the voltage sustaining layer (composed of 31 and 32), a collector C formed by a conductor 1 covering the collector structure (composed of 10 and 20), an emitter E formed by a conductor 2 covering the emitter region 44 and the base region (composed of 41 and 43, or composed of 41, 42, 43, and 45), a gate G formed by a conductor 3 covering the trench gate structure (composed of 47 and 48) configured for controlling on and off, wherein (Referring to FIGS. 2-9):

the voltage sustaining layer (composed of 31 and 32) is composed of at least one semiconductor region 31 of the first conductivity type and at least one semiconductor region 32 of the second conductivity type, the semiconductor region 31 of the first conductivity type of the voltage sustaining layer (composed of 31 and 32) is in contact with the semiconductor region 32 of the second conductivity type of the voltage sustaining layer (composed of 31 and 32), and a contact surface formed by the semiconductor region 31 of the first conductivity type of the voltage sustaining layer (composed of 31 and 32) and the semiconductor region 32 of the second conductivity type of the voltage sustaining layer (composed of 31 and 32) is perpendicular or approximately perpendicular to the collector structure (composed of 10 and 20) and the base region (composed of 41 and 43, or composed of 41, 42, 43, and 45);

the voltage sustaining layer (composed of 31 and 32) and the base region (composed of 41 and 43, or composed of 41, 42, 43, and 45) are not in direct contact, but are in indirect contact via a carrier storage layer 33 of the first conductivity type;

the collector structure (composed of 10 and 20) is composed of at least one collector region 10 of the second conductivity type and at least one buffer region 20 of the first conductivity type, the buffer region 20 is in contact with the voltage sustaining layer (composed of 31 and 32), and the collector region 10 is in direct contact with the collector C;

the voltage sustaining layer (composed of 31 and 32) is in direct contact with the buffer region 20 or is in indirect contact with the buffer region 20 via an assist layer 30 of the first conductivity type;

the trench gate structure (composed of 47 and 48) configured for controlling on and off includes at least one insulated dielectric layer 48 and at least one conductor region 47; the insulated dielectric layer 48 of the trench gate structure configured for controlling on and off is in direct contact with the emitter region 44, the base region (composed of 41 and 43, or composed of 41, 42, 43, and 45), the carrier storage layer 33, and the semiconductor region 31 of the first conductivity type of the voltage sustaining layer (composed of 31 and 32), or is in direct contact with the emitter region 44, the base region (composed of 41 and 43, or composed of 41, 42, 43, and 45), the carrier storage layer 33, the semiconductor region 31 of the first conductivity type of the voltage sustaining layer (composed of 31 and 32), and the semiconductor region 32 of the second conductivity type of the voltage sustaining layer (composed of 31 and 32); the conductor region 47 of the trench gate structure configured for controlling on and off is in direct contact with the insulated dielectric layer 48 of the trench gate structure (composed of 47 and 48) configured for controlling on and off, and is isolated from the emitter region 44, the base region (composed of 41 and 43, or composed of 41, 42, 43, and 45), the carrier storage layer 33 and the voltage sustaining layer (composed of 31 and 32) by the insulated dielectric layer 48 of the trench gate structure (composed of 47 and 48) configured for controlling on and off, and the conductor region 47 of the trench gate structure configured for controlling on and off is in direct contact with the gate G;

At least one first-type trench gate structure (composed of 46 and 48) configured for providing a carrier path of the second conductivity type is also provided in the cell structure, the first-type trench gate structure (composed of 46 and 48) configured for providing a carrier path of the second conductivity type includes at least one insulated dielectric layer 48 and at least one conductor region 46, the insulated dielectric layer 48 of the first-type trench gate structure (composed of 46 and 48) configured for providing a carrier path of the second conductivity type is in direct contact with the base region (composed of 41 and 43, or composed of 41, 42, 43, and 45), the carrier storage layer 33, and the semiconductor region 32 of the second conductivity type of the voltage sustaining layer (composed of 31 and 32), the insulated dielectric layer 48 of the first-type trench gate structure (composed of 46 and 48) configured for providing a carrier path of the second conductivity type may also be in direct contact with the semiconductor region 31 of the first conductivity type of the voltage sustaining layer (composed of 31 and 32); the conductor region 46 of the first-type trench gate structure (composed of 46 and 48) configured for providing a carrier path of the second conductivity type is in direct contact with the insulated dielectric layer 48 of the first-type trench gate structure (composed of 46 and 48) configured for providing a carrier path of the second conductivity type and is isolated from the emitter region 44, the base region (composed of 41 and 43, or composed of 41, 42, 43, and 45), the carrier storage layer 33 and the voltage sustaining layer (composed of 31 and 32) by the insulated dielectric layer 48 of the first-type trench gate structure (composed of 46 and 48) configured for providing a carrier path of the second conductivity type; the conductor region 46 of the first-type trench gate structure (composed of 46 and 48) configured for providing a carrier path of the second conductivity type is in direct contact with the emitter E;

At least one second-type trench gate structure (composed of 46 and 48) configured for providing a carrier path of the second conductivity type may also be present in the cell structure, the second-type trench gate structure (composed of 46 and 48) configured for providing a carrier path of the second conductivity type includes at least one insulated dielectric layer 48 and at least one conductor region 46, the insulated dielectric layer 48 of the second-type trench gate structure (composed of 46 and 48) configured for providing a carrier path of the second conductivity type is in direct contact with the base region (composed of 41 and 43, or composed of 41, 42, 43, and 45), the carrier storage layer 33, and the semiconductor region 31 of the first conductivity type of the voltage sustaining layer (composed of 31 and 32); the conductor region 46 of the second-type trench gate structure (composed of 46 and 48) configured for providing a carrier path of the second conductivity type is in direct contact with the insulated dielectric layer 48 of the second-type trench gate structure (composed of 46 and 48) configured for providing a carrier path of the second conductivity type, and is isolated from the emitter region 44, the base region (composed of 41 and 43, or composed of 41, 42, 43, and 45), the carrier storage layer 33 and the voltage sustaining layer (composed of 31 and 32) by the insulated dielectric layer 48 of the second-type trench gate structure (composed of 46 and 48) configured for providing a carrier path of the second conductivity type; the conductor region 46 of the second-type trench gate structure (composed of 46 and 48) configured for providing a carrier path of the second conductivity type is in direct contact with the emitter E;

At least one third-type trench gate structure (composed of 47 and 48) configured for providing a carrier path of the second conductivity type may also be present in the cell structure, the third-type trench gate structure (composed of 47 and 48) configured for providing a carrier path of the second conductivity type includes at least one insulated dielectric layer 48 and at least one conductor region 47, the insulated dielectric layer 48 of the third-type trench gate structure (composed of 47 and 48) configured for providing a carrier path of the second conductivity type is in direct contact with the base region (composed of 41 and 43, or composed of 41, 42, 43, and 45), the carrier storage layer 33, and the semiconductor region 32 of the second conductivity type of the voltage sustaining layer (composed of 31 and 32) or/and the semiconductor region 31 of the first conductivity type of the voltage sustaining layer (composed of 31 and 32); the conductor region 47 of the third-type trench gate structure (composed of 47 and 48) configured for providing a carrier path of the second conductivity type is in direct contact with the insulated dielectric layer 48 of the third-type trench gate structure (composed of 47 and 48) configured for providing a carrier path of the second conductivity type and is isolated from the emitter region 44, the base region (composed of 41 and 43, or composed of 41, 42, 43, and 45), the carrier storage layer 33 and the voltage sustaining layer (composed of 31 and 32) by the insulated dielectric layer 48 of the third-type trench gate structure (composed of 47 and 48) configured for providing a carrier path of the second conductivity type; the conductor region 47 of the third-type trench gate structure (composed of 47 and 48) configured for providing a carrier path of the second conductivity type is in direct contact with the gate G;

the conductor regions in the trench gate structures (composed of 47 and 48, and composed of 46 and 48) are composed of a heavily doped polycrystalline semiconductor material and/or other conductor materials;

at least one heavily doped region (43 and 45) in the base region (composed of 41 and 43, or composed of 41, 42, 43, and 45) is in direct contact with the emitter E to form an ohmic contact;

when the first conductivity type is n-type, the second conductivity type is p-type, and the carrier of the second conductivity type is a hole; and when the first conductivity type is p-type, the second conductivity type is n-type, and the carrier of the second conductivity type is an electron.

Referring to FIGS. 10-11, the trench gate structures (composed of 47 and 48, and composed of 46 and 48) and the base region (composed of 41 and 43, or composed of 41, 42, 43, and 45) are arranged in a strip-shaped or hexagonal or circular or rectangular manner, and the semiconductor region 31 of the first conductivity type and the semiconductor region 32 of the second conductivity type in the voltage sustaining layer (composed of 31 and 32) are arranged in a strip-shaped or hexagonal or circular or rectangular manner; and the trench gate structures (composed of 47 and 48, and composed of 46 and 48) and the base region (composed of 41 and 43, or composed of 41, 42, 43, and 45) are arranged in the same or different arrangement manners as the semiconductor region 31 of the first conductivity type and the semiconductor region 32 of the second conductivity type in the voltage sustaining layer (composed of 31 and 32).

Referring to FIGS. 12-13, the base region (composed of 41 and 43, or composed of 41, 42, 43, and 45) is an interconnected base region (composed of 41 and 43) or is divided into several mutually isolated base regions (composed of 41 and 43, or composed of 42 and 45) by the trench gate structures (composed of 47 and 48, and composed of 46 and 48).

Referring to FIG. 14, a doping concentration of the carrier storage layer 33 is higher than a doping concentration of the semiconductor region 31 of the first conductivity type of the voltage sustaining layer (composed of 31 and 32), or is equal to or close to a doping concentration of the semiconductor region 31 of the first conductivity type of the voltage sustaining layer (composed of 31 and 32).

Referring to FIG. 15, a doping concentration of the assist layer 30 is lower than a doping concentration of the semiconductor region 31 of the first conductivity type of the voltage sustaining layer (composed of 31 and 32), or is equal to or close to a doping concentration of the semiconductor region 31 of the first conductivity type of the voltage sustaining layer (composed of 31 and 32), or is equal to or close to a doping concentration of the semiconductor region 31 of the first conductivity type of the voltage sustaining layer (composed of 31 and 32) and a doping concentration of the carrier storage layer 33.

Reference is made to FIG. 16, a doping concentration of the buffer region 20 is higher than a doping concentration of the assist layer 30, or is equal to or close to a doping concentration of the assist layer 30, or is equal to or close to a doping concentration of the assist layer 30 and a doping concentration of the semiconductor region 31 of the first conductivity type of the voltage sustaining layer (composed of 31 and 32), or is equal to or close to a doping concentration of the assist layer 30, a doping concentration of the semiconductor region 31 of the first conductivity type and a doping concentration of the carrier storage layer 33.

Referring to FIG. 17, at least one lightly doped semiconductor region 34 of the first conductivity type is included in the semiconductor region 31 of the first conductivity type of the voltage sustaining layer (composed of 31 and 32); a bottom of the semiconductor region 32 of the second conductivity type of the voltage sustaining layer (composed of 31 and 32) is surrounded by the semiconductor region 31 of the first conductivity type of the voltage sustaining layer (composed of 31 and 32); the lightly doped semiconductor region 34 of the first conductivity type is in direct contact with the buffer region 20 or is in direct contact with the assist layer 30, the lightly doped semiconductor region 34 of the first conductivity type is further in direct contact with the carrier storage layer; the doping concentration of the lightly doped semiconductor region 34 of the first conductivity type is the same as or close to the doping concentration of the assist layer 30.

Referring to FIG. 18, bottoms of the trench gate structures (composed of 47 and 48, and composed of 46 and 48) are surrounded by heavily doped semiconductor regions 35 of the second conductivity type; and the heavily doped semiconductor region 35 of the second conductivity type is in direct contact with the voltage sustaining layer (composed of 31 and 32).

Referring to FIGS. 2-16 and 18, when the first conductivity type is n-type, total charges of the effective donor impurities in the semiconductor region 31 of the first conductivity type of the voltage sustaining layer (composed of 31 and 32) have a no more than 50% difference relative to total charges of the effective acceptor impurities in the semiconductor region 32 of the second conductivity type of the voltage sustaining layer (composed of 31 and 32); when the first conductivity type is p-type, total charges of the effective acceptor impurities in the semiconductor region 31 of the first conductivity type of the voltage sustaining layer (composed of 31 and 32) have a no more than 50% difference relative to total charges of the effective donor impurities in the semiconductor region 32 of the second conductivity type of the voltage sustaining layer (composed of 31 and 32).

Referring to FIG. 17, when the first conductivity type is n-type, total charges of the effective donor impurities in the semiconductor region 31 of the first conductivity type of the voltage sustaining layer (composed of 31 and 32) and the lightly doped semiconductor region 34 of the first conductivity type in the semiconductor region 31 of the first conductivity type of the voltage sustaining layer (composed of 31 and 32) have a no more than 50% difference relative to total charges of the effective acceptor impurities in the semiconductor region 32 of the second conductivity type of the voltage sustaining layer (composed of 31 and 32); when the first conductivity type is p-type, total charges of the effective acceptor impurities in the semiconductor region 31 of the first conductivity type of the voltage sustaining layer (composed of 31 and 32) and the lightly doped semiconductor region 34 of the first conductivity type in the semiconductor region 31 of the first conductivity type of the voltage sustaining layer (composed of 31 and 32) have a no more than 50% difference relative to total charges of the effective donor impurities in the semiconductor region 32 of the second conductivity type of the voltage sustaining layer (composed of 31 and 32).

BRIEF DESCRIPTION OF THE DRAWINGS

FIG. 1(*a*) is a schematic diagram of a common semi-superjunction IGBT structure;

FIG. 1(*b*) is a schematic diagram of a p-pillar floating semi-superjunction IGBT structure;

FIG. 2 is a superjunction IGBT of the disclosure including only a first-type trench gate structure configured for providing a hole path, which is in direct contact with the p-pillar and not in direct contact with the n-pillar;

FIG. 4 (*b*): Another semi-superjunction IGBT of the disclosure including only a first-type trench gate structure configured for providing a hole path, which is in direct contact with both the p-pillar and the n-pillar;

FIG. 5 (*b*): Another semi-superjunction IGBT of the disclosure including only a first-type trench gate structure configured for providing a hole path, in which some of the trench gate structures are in direct contact with the p-pillar and not in direct contact with the n-pillar, some of which are in direct contact with both the p-pillar region and the n-pillar;

FIG. 6 (b): Another semi-superjunction IGBT of the disclosure including a first-type trench gate structure configured for providing a hole path and a second trench gate structure configured for providing a hole path;

FIG. 7 (b): Another semi-superjunction IGBT of the disclosure including a first-type trench gate structure configured for providing a hole path and a third-type trench gate structure configured for providing a hole path, where the third-type trench gate structure configured for providing a hole path is in direct contact with both the p-pillar and the n-pillar;

FIG. 8 (b): Another semi-superjunction IGBT of the disclosure including a first-type trench gate structure configured for providing a hole path and a third-type trench gate structure configured for providing a hole path, where the third-type trench gate structure configured for providing a hole path is in direct contact with the p-pillar and not in direct contact with the n-pillar;

FIG. 9 (b): Another semi-superjunction IGBT of the disclosure including a first-type trench gate structure configured for providing a hole path and a third type trench gate structure configured for providing a hole path, where the third-type trench gate structure configured for providing a hole passage is in direct contact with the n-pillar and not in direct contact with the p-pillar;

FIG. 14 (b): According to FIG. 8 (b), another semi-superjunction IGBT of the disclosure has the same doping concentration of n-type carrier storage layer and n-pillar;

FIG. 15 (b): According to FIG. 8 (b), the disclosure further discloses a semi-superjunction IGBT, wherein the n-type assist layer has the same doping concentration as the n-pillar;

FIG. 16 (b): According to FIG. 8 (b), another semi-superjunction IGBT of the disclosure has a same doping concentration of the n-type buffer, n-type assist layer and n-pillar;

FIG. 17 (b): According to FIG. 8 (b), another semi-superjunction IGBT of the disclosure has a lightly doped n region in the n-pillar, and the lightly doped n region has the same doping concentration as the n-type assist layer;

FIG. 18 (b): According to FIG. 8 (b), another semi-superjunction IGBT of the disclosure, where bottoms of the trench gate structures are surrounded by p+ regions;

DETAILED DESCRIPTION OF EMBODIMENTS

Figure 3:
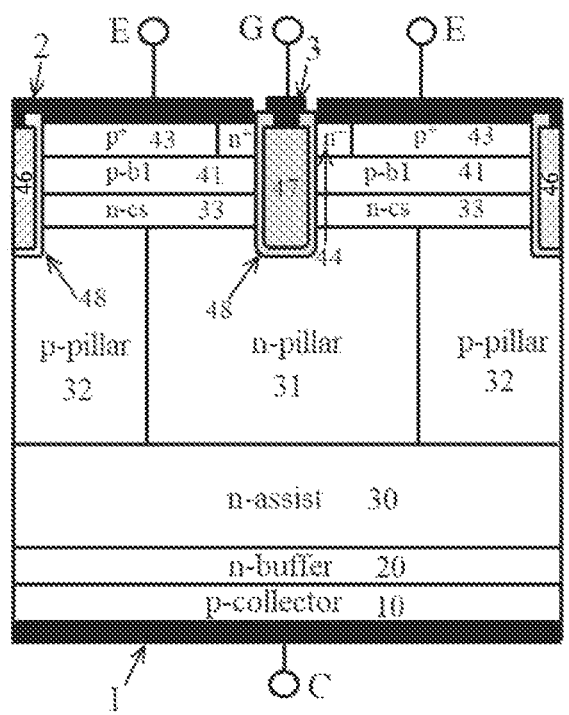
FIG. 3 is a semi-superjunction IGBT of the disclosure, including only a first-type trench gate structure configured for providing a hole path, which is in direct contact with the p-pillar and not in direct contact with the n-pillar.

The following describes the disclosure in detail with reference to the accompanying drawings.

FIG. 1 (a) is a schematic diagram of a common semi-superjunction IGBT structure. Compared to a super-junction IGBT, a semi-superjunction IGBT is provided with an n-type assist layer (n-assist layer 30) for withstanding a partial applied voltage between an n-pillar (n-pillar region 31) with a p-pillar (p-pillar region 32) and an n-type buffer region (n-buffer region 20), wherein the doping concentration of the n-type assist layer (n-assist layer 30) may be lower than or equal to the doping concentration of the n-pillar (n-pillar region 31). When the gate (G) is applied with a voltage over a threshold voltage, an electron channel is formed near the interface of a base region (p-b1 region 41) and a gate dielectric (48); if a positive voltage over 0.7 V is applied to the collector (C), the electrons from the emitter (E) flow through an emitter region (n+ region 44) and the electron channel into the n-pillar (n-pillar region 31), the n-type assist layer (n-assist layer 30), and the n-type buffer region (n-buffer region 20), and then into an collector region (p-collector region 10) under the action of the electric field; then, the holes enter from the collector (C) into the collector region (p-collector region 10), and then are injected into the n-type buffer region (n-buffer region 20), the n-type assist layer (n-assist layer 30) and the n-pillar (n-pillar region 31), and thus the device is turned on. Due to the reverse bias of the pn junction formed by the p-pillar (p-pillar region 32) and the n-pillar (n-pillar region 31) as well as the n-type assist layer (n-assist layer 30), holes are easily collected by the p-pillar (p-pillar region 32) and enter into the base region (p-b1 region 41). Therefore, the carrier storage effect (conduction modulation effect) in the body is weak, and the conduction voltage is relatively high.

FIG. 1 (b) is a schematic diagram of a p-pillar floating semi-superjunction IGBT structure. Unlike FIG. 1 (a), there is an n-type carrier storage layer (n-cs layer 33) between the p-pillar (p-pillar region 32) and the base region (p-b1 region 41) of FIG. 1 (b). At the on state, the built-in potential of the pn junction formed by the p-pillar (p-pillar region 32) and the n-type carrier storage layer (n-cs layer 33) inhibits holes from entering the base region (p-b1 region 41) from the p-pillar (p-pillar region 32), thereby enhancing the carrier storage effect in the body and reducing the conduction voltage drop. In addition, when the doping concentration of the n-type carrier storage layer (n-cs layer 33) is higher than the doping concentration of the n-pillar region 31, the n-type carrier storage layer (n-cs layer 33) can prevent holes from entering the base region (p-b1 region 41) from the n-pillar region 31, which further enhances the carrier storage effect in the body. However, the structure of FIG. 1 (b) also has some disadvantages. First, the pnp transistor formed by the p-pillar (p-pillar region 32), n-type carrier storage layer (n-cs layer 33) and the base region (p-b1 region 41) have a limited capability to flow hole current; if a large hole current flows through the p-pillar (p-pillar region 32) at a certain moment during the switching process, the potential of the p-pillar (p-pillar region 32) can be suddenly increased, which brings some adverse effects to the switching reliability of the device. Second, although increasing the doping concentration of the n-type carrier storage layer (n-cs layer 33) can enhance the carrier storage effect, the saturation current of the device can be increased, and the short-circuit capability will be reduced. Third, if the doping concentration of the n-type carrier storage layer (n-cs layer 33) is relatively high, the reverse biased pn junction formed by the n-type carrier storage layer (n-cs layer 33) and the base region (p-b1 region 41) is prone to breakdown, resulting in a reduced breakdown voltage of the device.

The main purpose of the disclosure is to improve the above-mentioned disadvantages of the p-pillar floating semi-superjunction IGBT shown in FIG. 1 (b).

FIG. 2 is a schematic diagram of a superjunction IGBT cell structure of the disclosure containing two types of trench gate structures. One is a trench gate structure (composed of 47 and 48) configured for controlling on and off and it is connected to the gate (G), and the other is a trench gate structure (composed of 46 and 48) configured for providing a hole path and it is connected to the emitter (E), wherein the insulated dielectric layer (48) may be a $SiO_2$ dielectric layer, and the conductor regions (46 and 47) may be heavily doped n-type or p-type polysilicon material. A first-type trench gate structure (composed of 46 and 48) configured for providing a hole path is in direct contact with a p-pillar (p-pillar region 32), an n-type carrier storage layer (n-cs layer 33) and a base region (composed of a p-b1 region 41 and a p+ region 43), which form a gate-drain shorted p-MISFET (metal-insulator-semiconductor field effect transistor), wherein the p-pillar (p-pillar region 32) is a source region thereof, the n-type carrier storage layer (n-cs layer 33) is a substrate region thereof, and the base region (formed by the p-b1 region 41 and the p+ region 43) is a drain region thereof. It should be noted that the heavily doped region (p+ region 43) in the base region is used to form a good ohmic contact with the emitter (E), and when the doping concentration of the surface of the base region (p-b1 region 41) is high enough, the heavily doped region (p+ region 43) in the base region is not necessary.

At the forward blocking state, electrons generated in the depletion region of the body flow to the collector (C) and holes flow to the emitter (E). When holes enter the p-pillar (p-pillar region 32), the potential of the p-pillar (p-pillar region 32) is raised, and the potential of the n-type carrier storage layer (n-cs layer 33) is also raised, so that the n-type carrier storage layer (n-cs layer 33) forms a hole channel near the interface of the insulated dielectric layer (48), and the gate-drain shorted p-MISFET is turned on to provide a hole path. Obviously, the reverse bias voltage of the pn junction formed by the n-type carrier storage layer (n-cs layer 33) and the base region (p-b1 region 41) can also be limited, so that avalanche breakdown at the pn junction is avoided. In addition, when the first-type trench gate structure (composed of 46 and 48) configured for providing a hole path sufficiently penetrates into the p-pillar (p-pillar region 32) or sufficiently close to the n-pillar (n-pillar region 31), the electric field lines generated by the ionization donors in the n-pillar (n-pillar region 31) are absorbed by the conductor region (48) of the first-type trench gate structure (composed of 46 and 48) configured for providing a hole path, which reduces the electric field in the n-type carrier storage layer (n-cs layer 33), and prevents avalanche breakdown of the n-type carrier storage layer (n-cs layer 33).

At a low forward conduction voltage, the potential of the p-pillar (p-pillar region 32) is not sufficient to enable the gate-drain shorted p-MISFET to be turned on. At this time, since the hole path of the p-pillar (p-pillar region 32) is not fluent, the carrier storage effect in the body is enhanced. When the forward conduction voltage continues to be increased, the potential of the p-pillar (p-pillar region 32) will be increased, the potential of the n-type carrier storage layer (n-cs layer 33) is also increased, and the gate-drain shorted p-MISFET is turned on to provide a fluent hole path.

In FIG. 3, the main difference with the structure of FIG. 2 is that there is an n-type assist layer (n-assist layer 30) between the n-type buffer region (n-buffer region 20) and the voltage sustaining layer (formed by the n-pillar region 31 and the p-pillar region 32). The doping concentration of the n-type assist layer (n-assist layer 30) may be the same or close to that of the n-pillar (n-pillar region 31), and may be even much lower than that of the n-pillar (n-pillar region 31).

Figure 4:
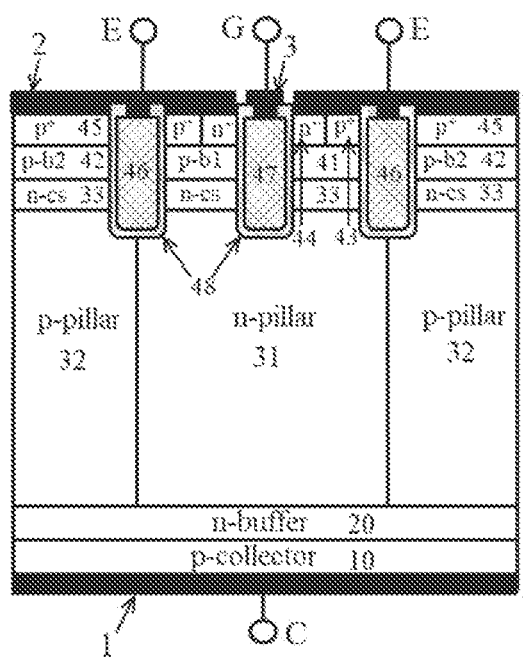
FIG. 4 (*a*): Another superjunction IGBT of the disclosure including only a first-type trench gate structure configured for providing a hole path, which is in direct contact with both the p-pillar and the n-pillar.
Figure 4:
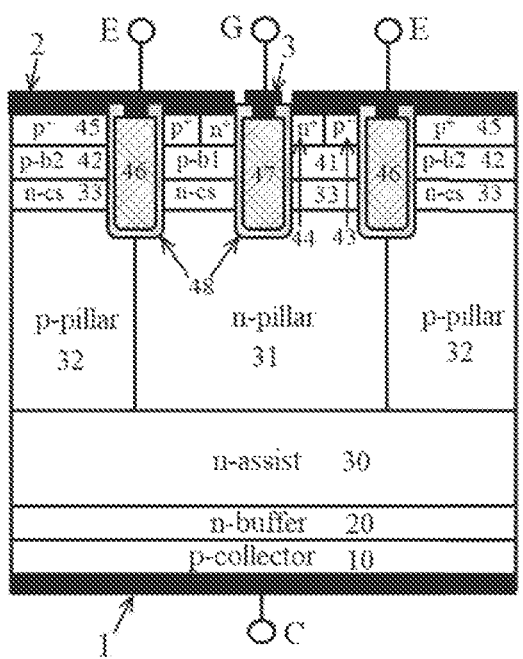

In FIG. 4 (a), the main difference between the structure of FIG. 2 is that the first-type trench gate structure (composed of 46 and 48) configured for providing a hole path is not only in direct contact with the p-pillar (p-pillar region 32) but also in direct contact with the n-pillar (n-pillar region 31). In addition, a first-type trench gate structure (composed of 46 and 48) configured for providing a hole path divides the base region (composed of the pb1 region 41, the pb2 region 42, the p+ region 43 and the p+ region 45) into two regions (the region formed by the pb1 region 41 and the p+ region 43, and the region formed by the pb2 region 42 and the p+ region 45), wherein the two regions may be completely isolated from each other and may also be locally isolated from each other and partially connected with each other.

In FIG. 4 (b), the main difference between the structure of FIG. 4 (a) is that there is an n-type assist layer (n-assist layer 30) between the n-type buffer region (n-buffer region 20) and the voltage sustaining layer (formed by the n-pillar region 31 and the p-pillar region 32).

Figure 5:
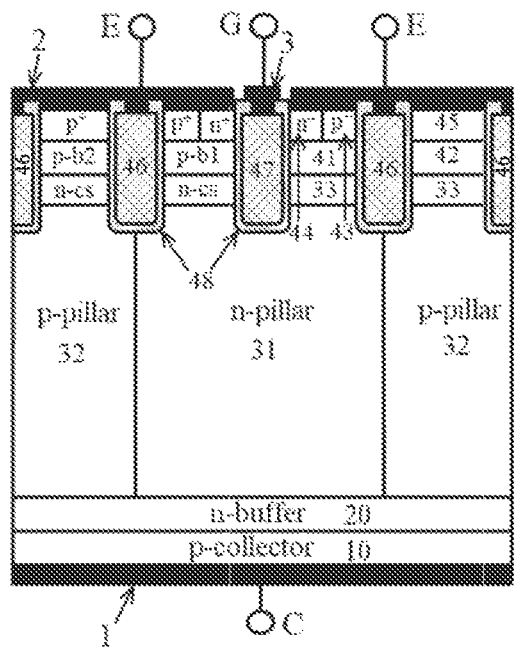
FIG. 5 (*a*): Another superjunction IGBT of the disclosure including only a first-type trench gate structure configured for providing a hole path, in which some of the trench gate structures are in direct contact with the p-pillar and not in direct contact with the n-pillar, some of which are in direct contact with both the p-pillar region and the n-pillar.
Figure 5:
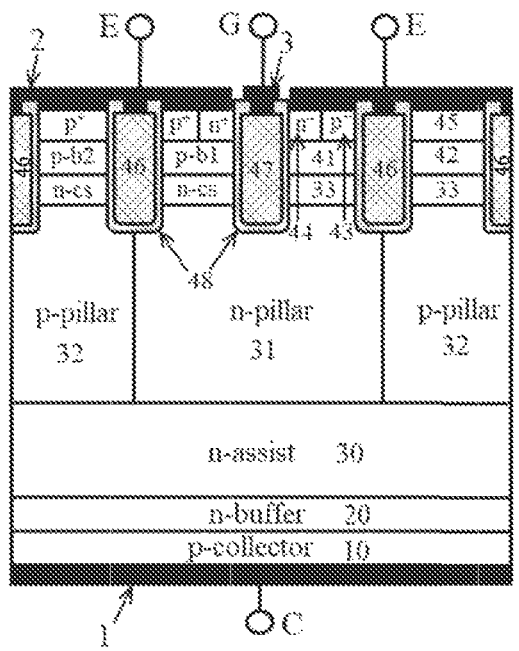

In FIG. 5 (a), the main difference between the structure of FIG. 2 is that some of the first-type trench gate structures (composed of 46 and 48) configured for providing a hole path are in direct contact with the p-pillar (p-pillar region 32) and not in direct contact with the n-pillar (n-pillar region 31), some of the first-type trench gate structures (composed of 46 and 48) configured for providing a hole path are in direct contact with both the p-pillar (p-pillar region 32) and the n-pillar (n-pillar region 31).

In FIG. 5 (b), the main difference between the structure of FIG. 5 (a) is that there is an n-type assist layer (n-assist layer 30) between the n-type buffer region (n-buffer region 20) and the voltage sustaining layer (formed by the n-pillar region 31 and the p-pillar region 32).

Figure 6:
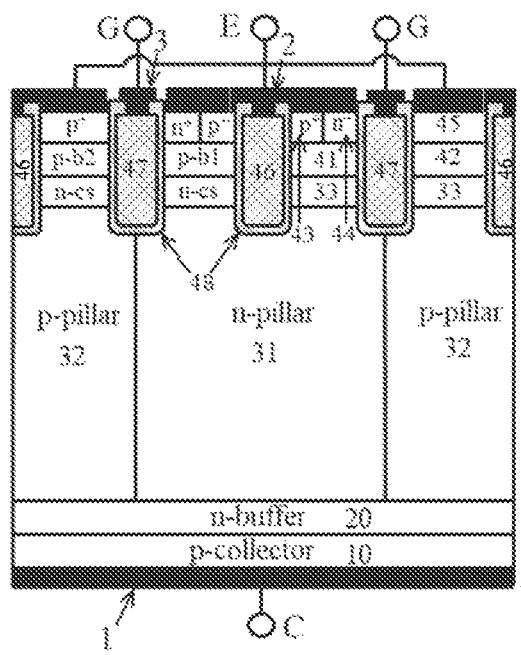
FIG. 6 (*a*): Another superjunction IGBT of the disclosure including a first-type trench gate structure configured for providing a hole path and a second-type trench gate structure configured for providing a hole path.
Figure 6:
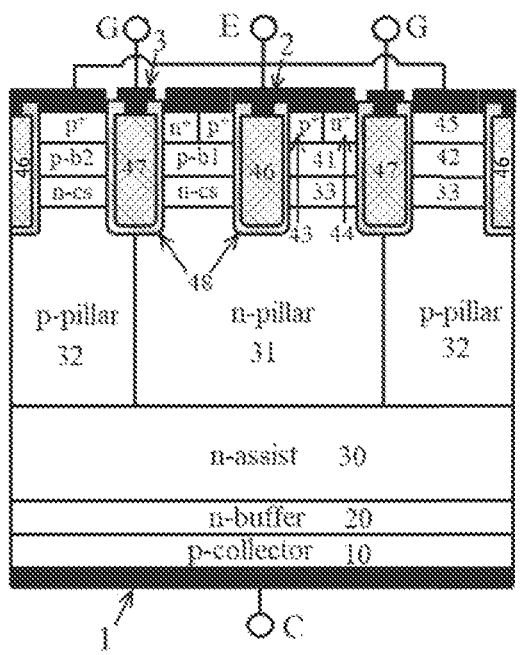

In FIG. 6 (a), the main difference between the structure of FIG. 2 is that a first-type trench gate structure (composed of 46 and 48) configured for providing a hole path and also a second-type trench gate structure (composed of 46 and 48) configured for providing a hole path are included in the cell. The second-type trench gate structure (composed of 46 and 48) configured for providing a hole path is also connected to the emitter (E). The second-type trench gate structure (composed of 46 and 48) configured for providing a hole path is in direct contact with the n-pillar (n-pillar region 31) and not in direct contact with the p-pillar (p-pillar region 32). During the turn-off process, the potential of the n-pillar (n-pillar region 31) underneath the second-type trench gate structure (composed of 46 and 48) configured for providing a hole path can be raised so that a hole channel can be formed near the interface of the second-type trench gate structure (composed of 46 and 48) configured for providing a hole path and the n-pillar (n-pillar region 31) as well as the n-type carrier storage layer (n-cs layer 33), and a part of holes in the n-pillar (n-pillar region 31) can flow into the emitter (E) through the hole channel.

In FIG. 6 (b), the main difference between the structure of FIG. 6 (a) is that there is an n-type assist layer (n-assist layer 30) between the n-type buffer region (n-buffer region 20) and the voltage sustaining layer (formed by the n-pillar region 31 and the p-pillar region 32).

Figure 7:
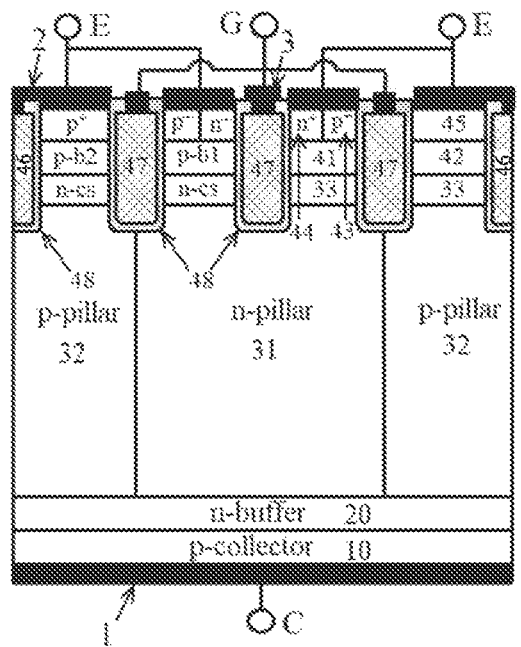
FIG. 7 (a): Another superjunction IGBT of the disclosure including a first-type trench gate structure configured for providing a hole path and a third-type trench gate structure configured for providing a hole path, where the third-type trench gate structure configured for providing a hole path is in direct contact with both the p-pillar and the n-pillar.
Figure 7:
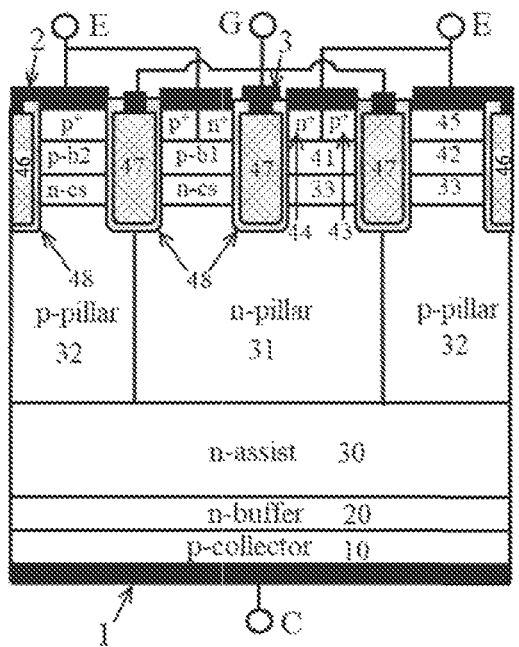

In FIG. 7 (a), the main difference between the structure of FIG. 2 is that a first-type trench gate structure (composed of 46 and 48) configured for providing a hole path and also a third-type trench gate structure (composed of 46 and 48) configured for providing a hole path are included in the cell. The third-type trench gate structure (composed of 47 and 48) configured for providing a hole path is connected to the gate (G). A third-type trench gate structure (composed of 47 and 48) configured for providing a hole path may be in direct contact with both the n-pillar (n-pillar region 31) and the p-pillar (p-pillar region 32). At the on state, the gate (G) voltage $V_G$ is a high positive voltage, and the third-type trench gate structure (composed of 47 and 48) configured for providing a hole path cannot provide a hole path. At the off state, $V_G$ is a high negative voltage, a hole accumulation layer can be formed near the interface of the third-type trench gate structure (composed of 46 and 48) configured for providing a hole path and the n-pillar (n-pillar region 31) as well as the n-type carrier storage layer (n-cs layer 33), and a very fluent hole path is provided.

In FIG. 7 (b), the main difference between the structure of FIG. 7 (a) is that there is an n-type assist layer (n-assist layer 30) between the n-type buffer region (n-buffer region 20) and the voltage sustaining layer (formed by the n-pillar region 31 and the p-pillar region 32).

Figure 8:
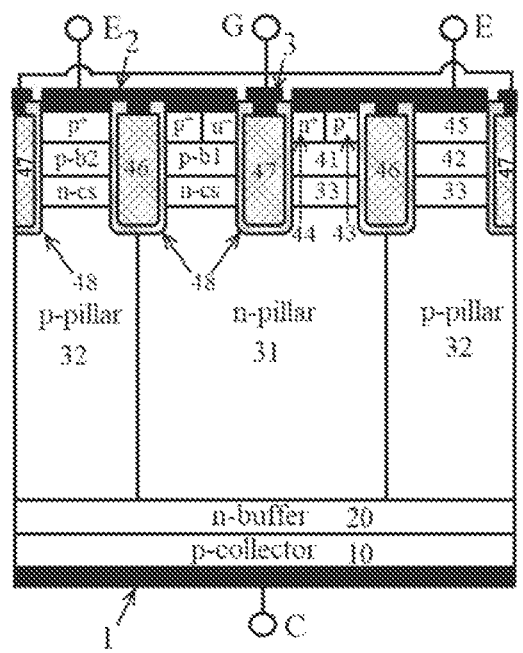
FIG. 8 (a): Another superjunction IGBT of the disclosure including a first-type trench gate structure configured for providing a hole path and a third-type trench gate structure configured for providing a hole path, where the third-type trench gate structure configured for providing a hole path is in direct contact with the p-pillar and not in direct contact with the n-pillar.
Figure 8:
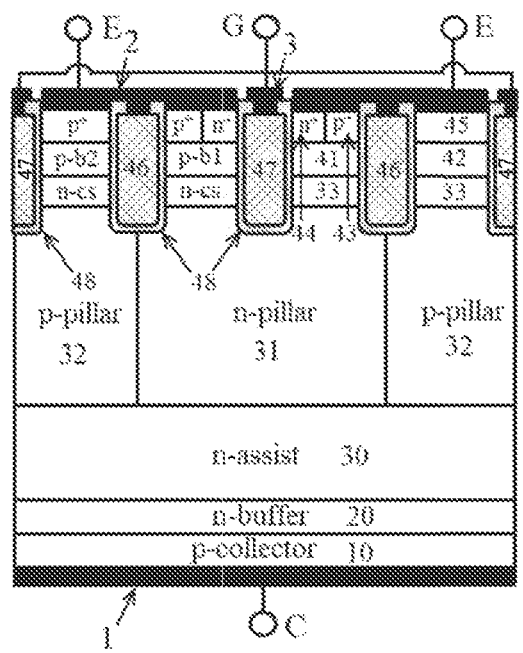

In FIG. 8 (a), the main difference between the structure of FIG. 7 (a) is that the third-type trench gate structure (composed of 47 and 48) configured for providing a hole path is in direct contact with the p-pillar (p-pillar region 32) and not in direct contact with the n-pillar (n-pillar region 31).

In FIG. 8 (b), the main difference between the structure of FIG. 8 (a) is that there is an n-type assist layer (n-assist layer 30) between the n-type buffer region (n-buffer region 20) and the voltage sustaining layer (formed by the n-pillar region 31 and the p-pillar region 32).

Figure 9:
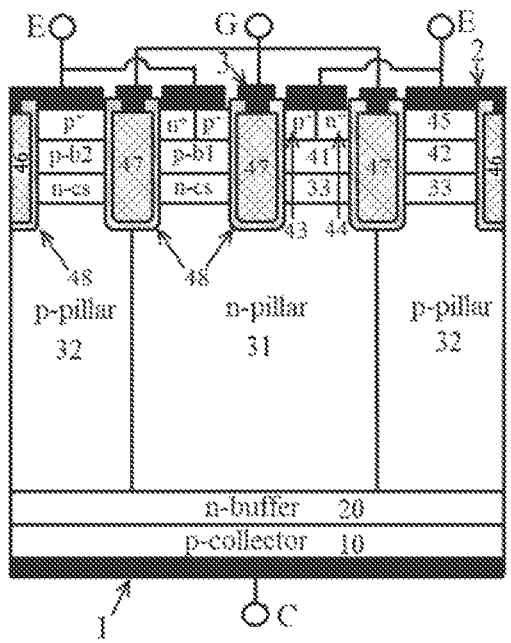
FIG. 9 (a): Another superjunction IGBT of the disclosure including a first-type trench gate structure configured for providing a hole path and a third-type trench gate structure configured for providing a hole path, where the third-type trench gate structure configured for providing a hole path is in direct contact with the n-pillar and not in direct contact with the p-pillar.
Figure 9:
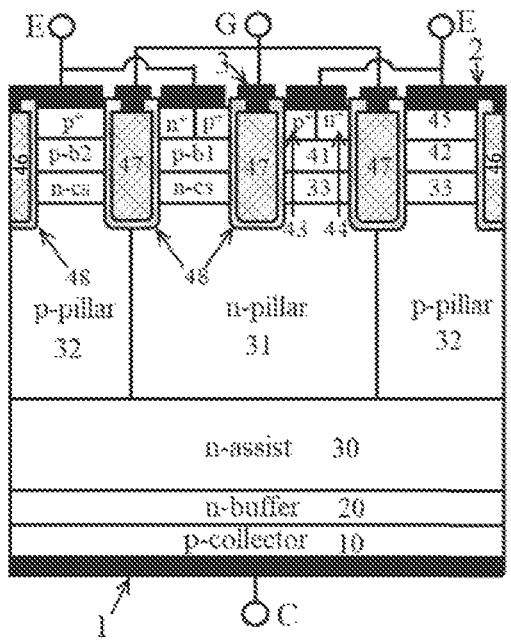

In FIG. 9 (a), the main difference between the structure of FIG. 7 (a) is that the third-type trench gate structure (composed of 47 and 48) configured for providing a hole path is in direct contact with the n-pillar (n-pillar region 31) and not in direct contact with the p-pillar (p-pillar region 32).

In FIG. 9 (b), the main difference between the structure of FIG. 9 (a) is that there is an n-type assist layer (n-assist layer 30) between the n-type buffer region (n-buffer region 20) and the voltage sustaining layer (formed by the n-pillar region 31 and the p-pillar region 32).

Figure 10:
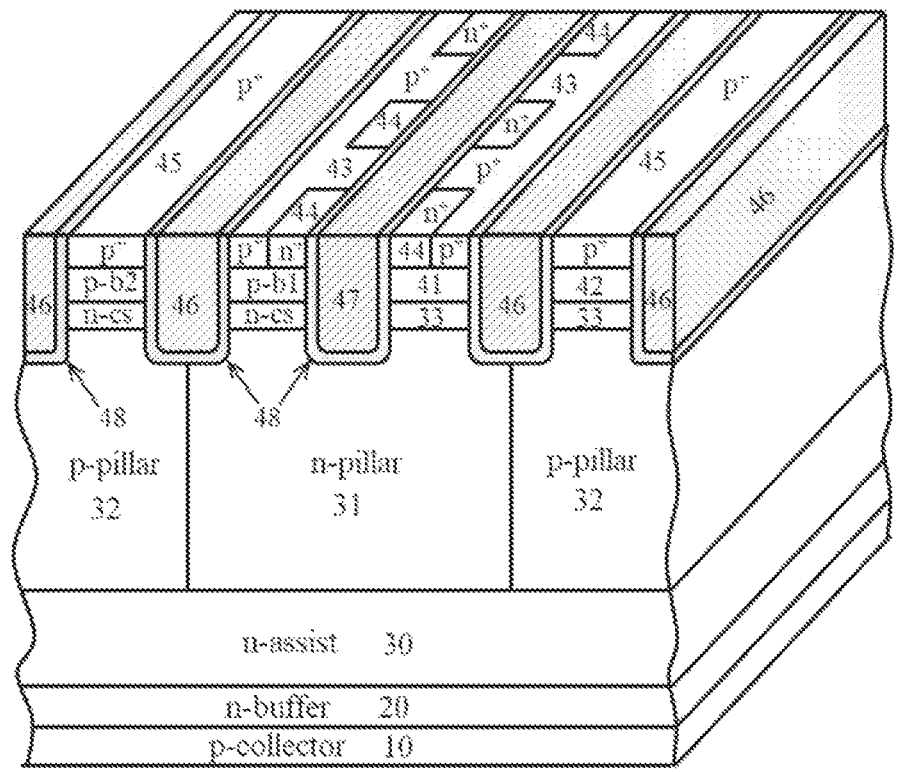
FIG. 10: According to FIG. 5 (b), a three-dimensional structure diagram of a semi-superjunction IGBT of the disclosure, wherein the trench gate structure and the base region are arranged in a strip shape, a semiconductor region of a first conductivity type and a semiconductor region of a second conductivity type of the voltage sustaining layer are also strip-shaped, and these two strip-shaped arrangements are parallel to each other.

In FIG. 10, the arrangement of the trench gate structures (composed of 46 and 48, and composed of 47 and 48) and the base region (composed of the pb1 region 41, the pb2 region 42, the p+ region 43, and the p+ region 45) is strip-shaped, the arrangement of the n-pillar (n-pillar region 31) and the p-pillar (p-pillar region 32) is also strip-shaped, and the strip-shaped trench gate structures (composed of 46 and 48 and composed of 47 and 48) are parallel to the strip-shaped n-pillars (n-pillar region 31). In addition, the emitter region (n+ region 44) may be strip-shaped or divided into a plurality of rectangular regions by a base region (p+ region 45).

Figure 11:
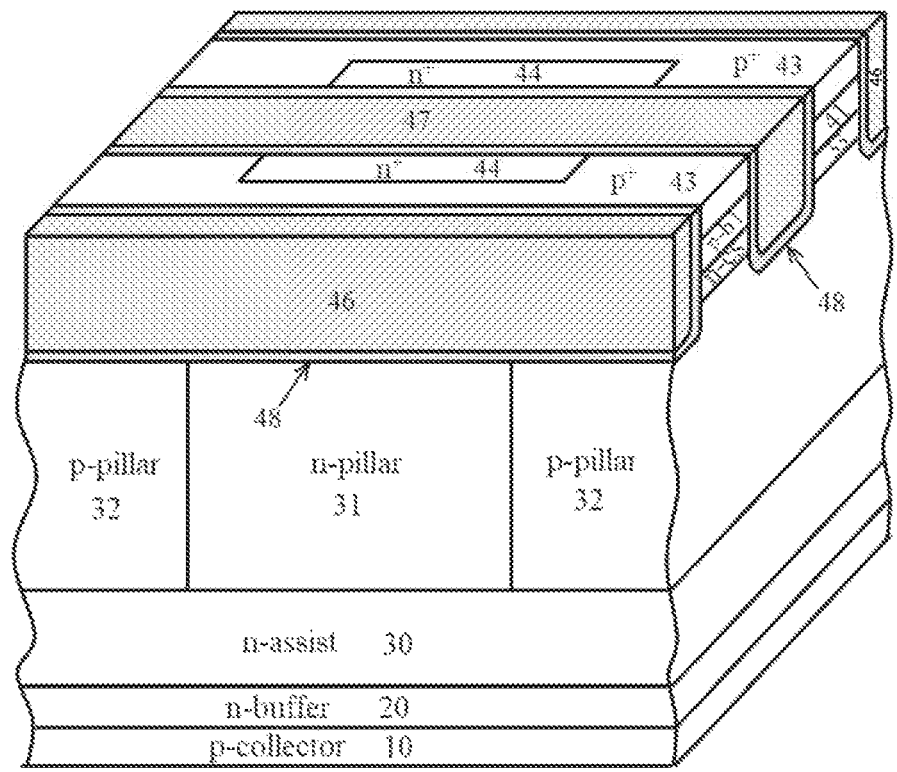
FIG. 11: According to FIG. 5 (b), a three-dimensional structure diagram of another semi-superjunction IGBT of the disclosure, the trench gate structure and the base region are arranged in a strip shape, the semiconductor region of the first conductivity type and the semiconductor region of the second conductivity type of the voltage sustaining layer are also strip-shaped, and these two strip-shaped arrangements are perpendicular to each other.

In FIG. 11, the arrangement of the trench gate structures (composed of 46 and 48, and composed of 47 and 48) and the base region (composed of the pb1 region 41, the pb2 region 42, the p+ region 43 and the p+ region 45) is strip-shaped, the arrangement of the n-pillar (n-pillar region 31) and the p-pillar (p-pillar region 32) is also strip-shaped, and the strip-shaped trench gate structures (composed of 46 and 48, and composed of 47 and 48) is perpendicular to the strip-shaped n-pillars (n-pillar region 31). In addition, the length of the emitter region (n+ region 44) may be the same as the length of the trench gate structure (composed of 47 and 48) configured for controlling on and off, or may be shorter than the length of the trench gate structure (composed of 47 and 48) configured for controlling on and off.

Figure 12:
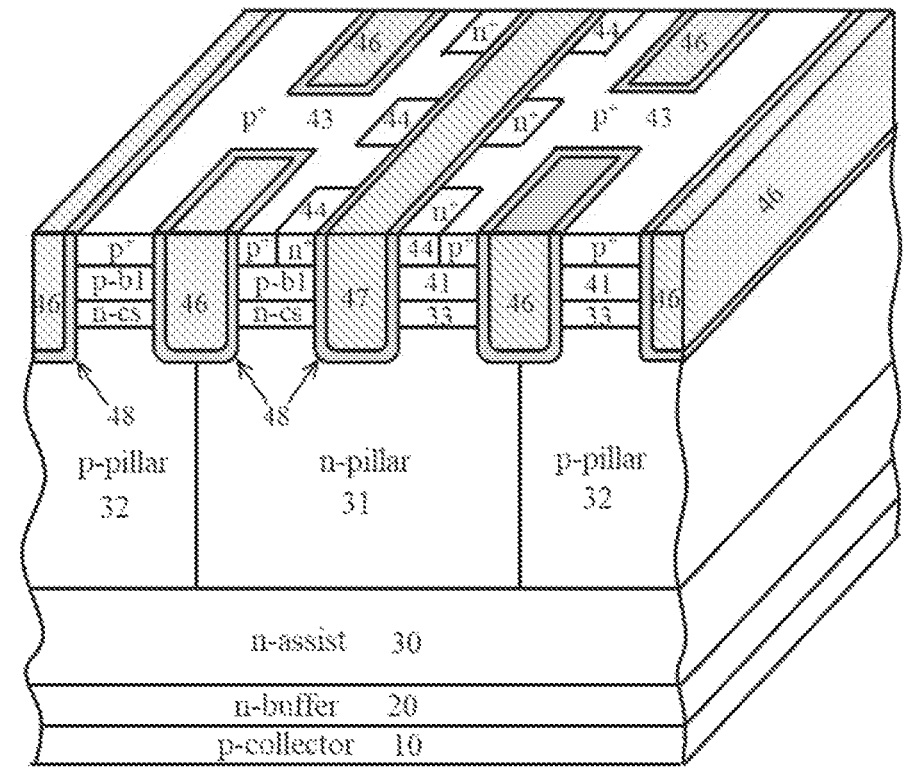
FIG. 12: According to FIG. 5 (b), a three-dimensional structure diagram of another semi-super-junction IGBT of the disclosure, in one cell of which, a trench gate structure configured for providing a hole path does not separate the base region.

The main difference between FIG. 12 and the structure of FIG. 10 is that a trench gate structure (composed of 46 and 48) configured for providing a hole path in the former does not separate the base region (made up of pb1 region 41 and p+ region 43), and a trench gate structure (composed of 46 and 48) configured for providing a hole path in the latter divides the base region (composed of pb1 region 41 and p+ region 43, and composed of pb2 region 42 and p+ region 45) into two regions.

Figure 13:
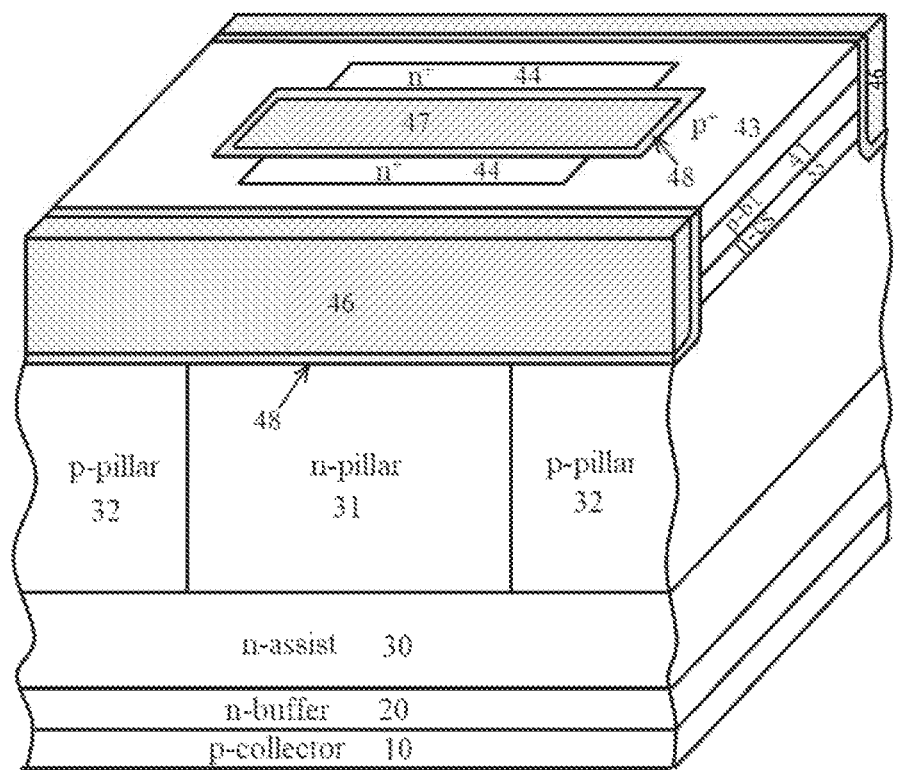
FIG. 13: According to FIG. 5 (b), a three-dimensional structure diagram of a semi-super-junction IGBT of the disclosure in one cell of which, a trench gate structure configured for controlling on and off does not separate the base region (composed of 41 and 43, or composed of 41, 42, 43, and 45)

The main difference between structures of FIG. 13 and FIG. 11 is that a trench gate structure (composed of 47 and 48) configured for controlling on and off in the former does not separate the base region (made up of pb1 region 41 and p+ region 43), and a trench gate structure (composed of 47 and 48) configured for controlling on and off in the later separates the base region (composed of pb1 region 41 and p+ region 43, and composed of pb2 region 42 and p+ region 45) into two regions.

Figure 14:
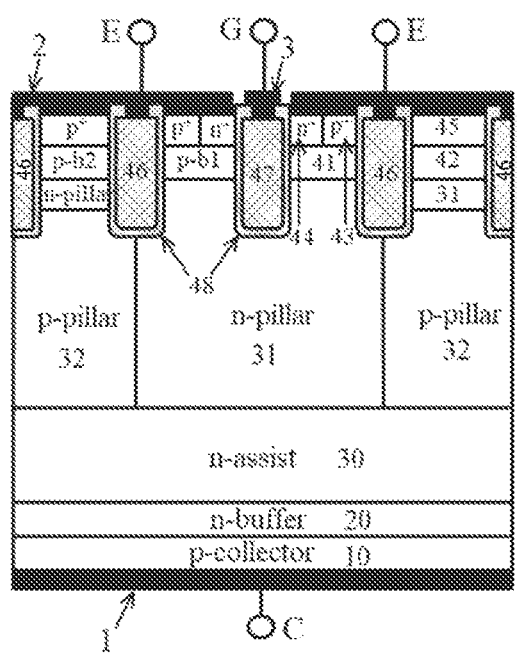
FIG. 14 (a): According to FIG. 5 (b), another semi-superjunction IGBT of the disclosure has a same doping concentration of n-type carrier storage layer and n-pillar.
Figure 14:
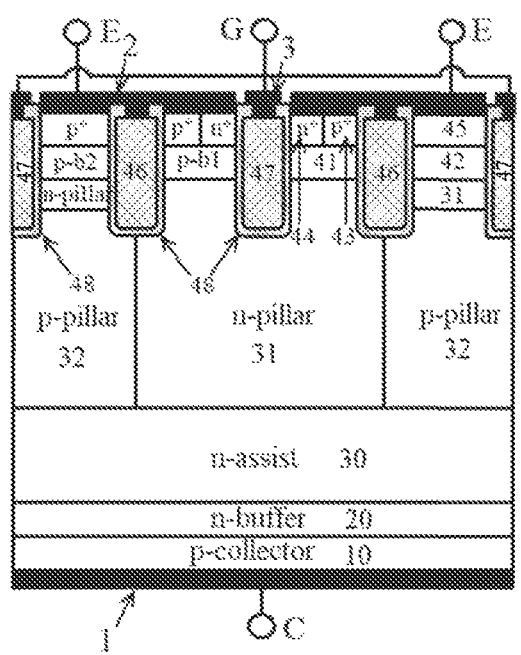

The main difference between structures of FIG. 14 (*a*) and FIG. 5 (*b*) and the main difference between structures of FIG. 14 (*b*) and FIG. 8 (*b*) are that the doping concentrations of the n-type carrier storage layer (n-cs layer 33) and the n-pillar (n-pillar region 31) are the same.

Figure 15:
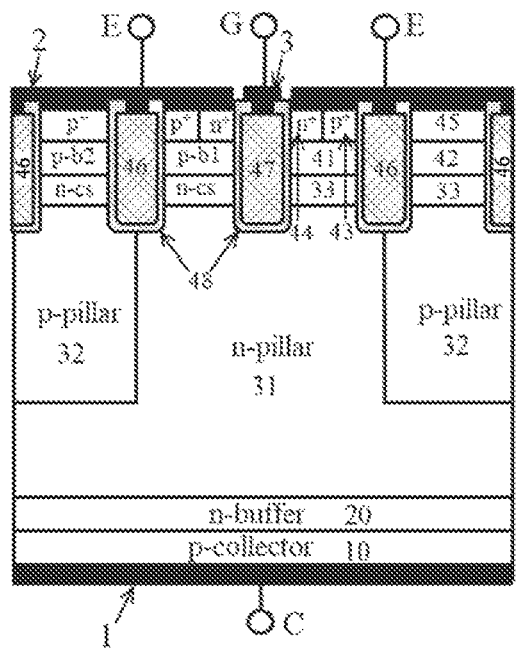
FIG. 15 (a): According to FIG. 5 (b), the disclosure further discloses a semi-superjunction IGBT, wherein the n-type assist layer has the same doping concentration as the n-pillar.
Figure 15:
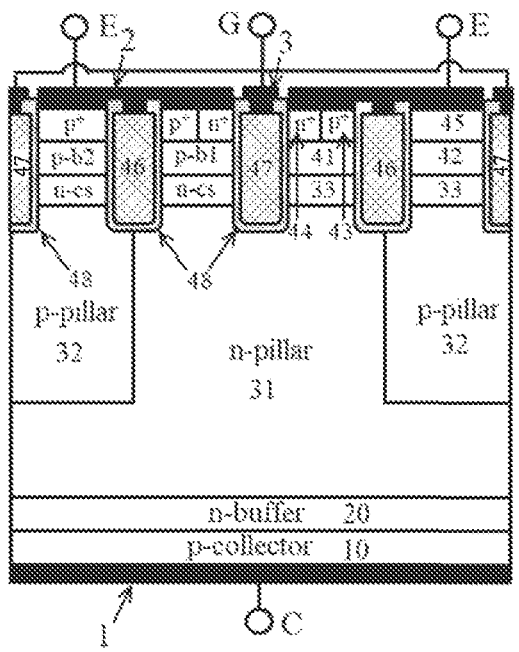

The main difference between structures of FIGS. 15 (*a*) and 5 (*b*) and the main difference between structures of FIG. 15 (*b*) and FIG. 8 (*b*) are that the doping concentrations of the n-type assist layer (n-assist layer 30) and the n-pillar (n-pillar region 31) are the same.

Figure 16:
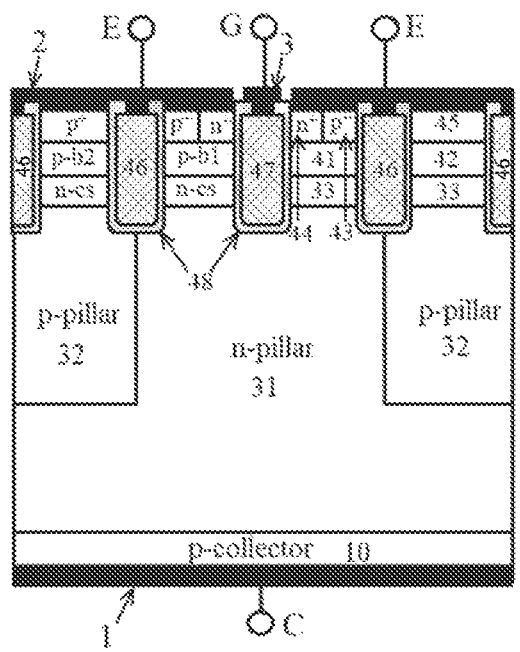
FIG. 16 (a): According to FIG. 5 (b), another semi-superjunction IGBT of the disclosure has a same doping concentration of the n-type buffer, n-type assist layer and n-pillar.
Figure 16:
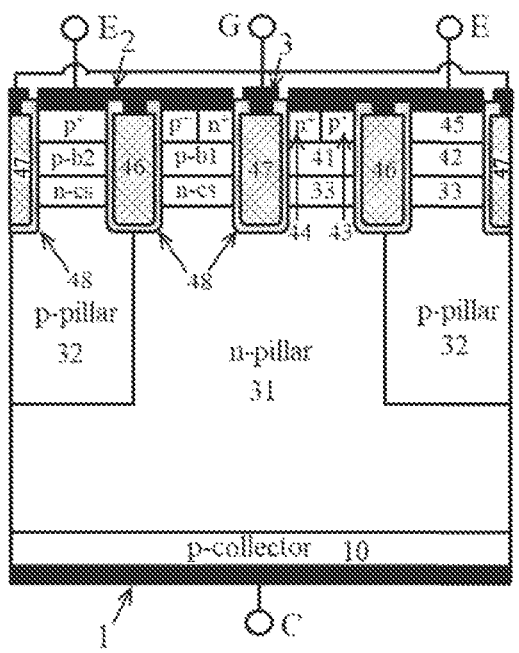

The main difference between structures of FIG. 16 (*a*) and FIG. 5 (*b*) and the main difference between structures of FIG. 16 (*b*) and FIG. 8 (*b*) are that the doping concentrations of the n-type buffer region (n-buffer region 20), the n-type assist layer (n-assist layer 30) and the n-pillar (n-pillar region 31) are the same.

Figure 17:
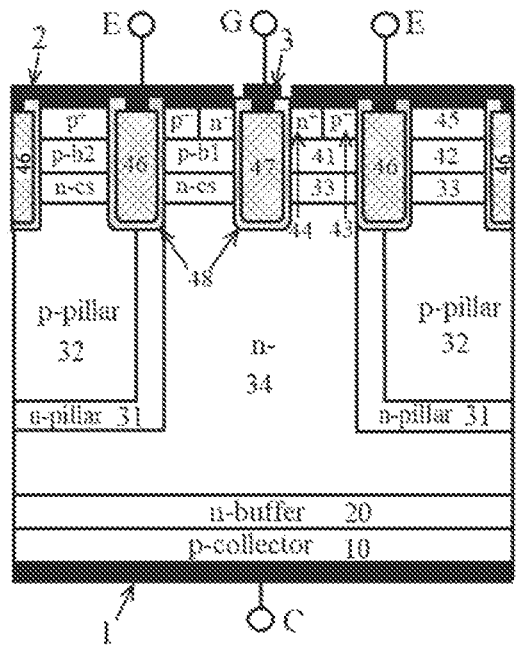
FIG. 17 (a): According to FIG. 5 (b), another semi-superjunction IGBT of the disclosure has a lightly doped n region in the n-pillar, and the lightly doped n region has the same doping concentration as the n-type assist layer.
Figure 17:
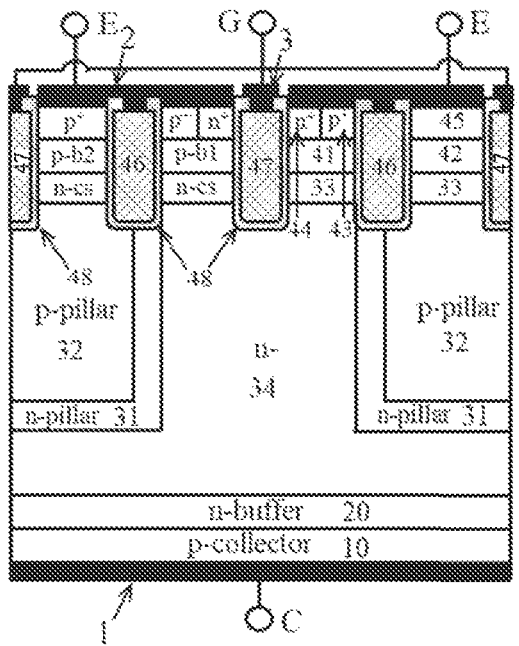

The main difference between structures of FIG. 17 (*a*) and FIG. 5 (*b*) and the main difference between structures of FIG. 17 (*b*) and FIG. 8 (*b*) lie in that there is a lightly doped n-type region (n region 34) in the n-pillar (n-pillar region 31), the bottom of the p-pillar (p-pillar region 32) is surrounded by the n-pillar (n-pillar region 31), and the doping concentrations of the n-type assist layer (n-assist layer 30) and the lightly doped n-type region (n region 34) are the same.

Figure 18:
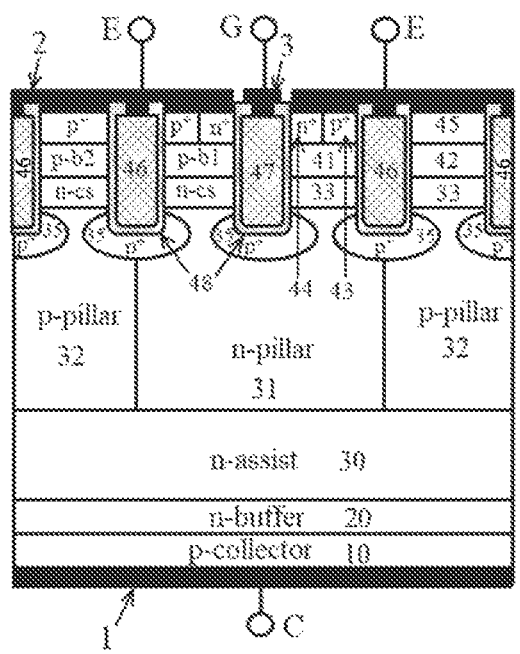
FIG. 18 (a): According to FIG. 5 (b), another semi-superjunction IGBT of the disclosure, where bottoms of the trench gate structures are surrounded by p+ regions.
Figure 18:
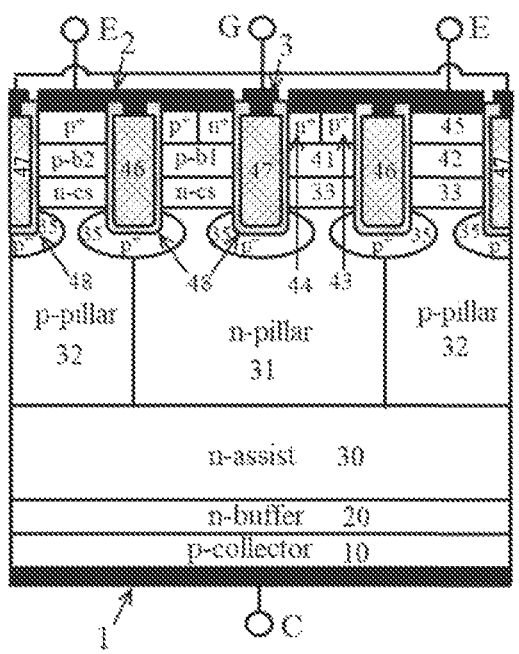

The main difference between structures of FIGS. 18 (*a*) and 5 (*b*) and the main difference between structures of FIG. 18 (*b*) and FIG. 8 (*b*) are that the trench gate structures (composed of 47 and 48, and composed of 46 and 48) are surrounded by heavily doped p-type regions (p+ region 35). When the device is withstanding voltage, the heavily doped p-type regions (p+ region 35) absorb the electric field lines generated by the ionization donors in the body, thereby protecting the trench gate structures (composed of 47 and 48, and composed of 46 and 48) and the n-type carrier storage layer (n-cs layer 33) to avoid suffering a high electric field.

In order to illustrate the superiority of the IGBT of the disclosure, the semi-superjunction IGBT structure of the disclosure is compared to a p-pillar floating semi-superjunction IGBT in FIG. 1 (*b*) as an example. The structures of FIG. 1 (*b*) and FIG. 5 (*b*) adopt the material of Si, and use a symmetrical superjunction structure; minority carrier lifetimes of electrons and holes are 5 μs; the width of the half-cell is 6 μm; the insulated dielectric layer (48) adopts $SiO_2$, the thickness of which is 0.1 μm; the thickness and doping concentration $N_{pillar}$ of the n-pillar (n-pillar region 31) and the p-pillar (p-pillar region 32) are 62 μm and $3 \times 10^{15}$ cm$^{-3}$, respectively; the thickness and doping concentration of the n-type assist layer (n-assist layer 30) are 30 μm and $1 \times 10^{14}$ cm$^{-3}$, respectively; the thickness and the peak doping concentration value of the n-type buffer region (n-buffer region 20) are 2 μm and $5 \times 10^{16}$ cm$^{-3}$, respectively; the thickness and the peak doping concentration value of the collector region (p-collector region 10) are 1 μm and $1 \times 10^{18}$ cm$^{-3}$, respectively; the thickness of the n-type carrier storage layer (n-cs layer 33) is 1.5 μm, and the doping concentration $N_{CS}$ of the n-type carrier storage layer (n-cs layer 33) adopts two groups of data (uniform doping of $3 \times 10^{15}$ cm$^{-3}$ and $3 \times 10^{16}$ cm$^{-3}$).

Figure 19:
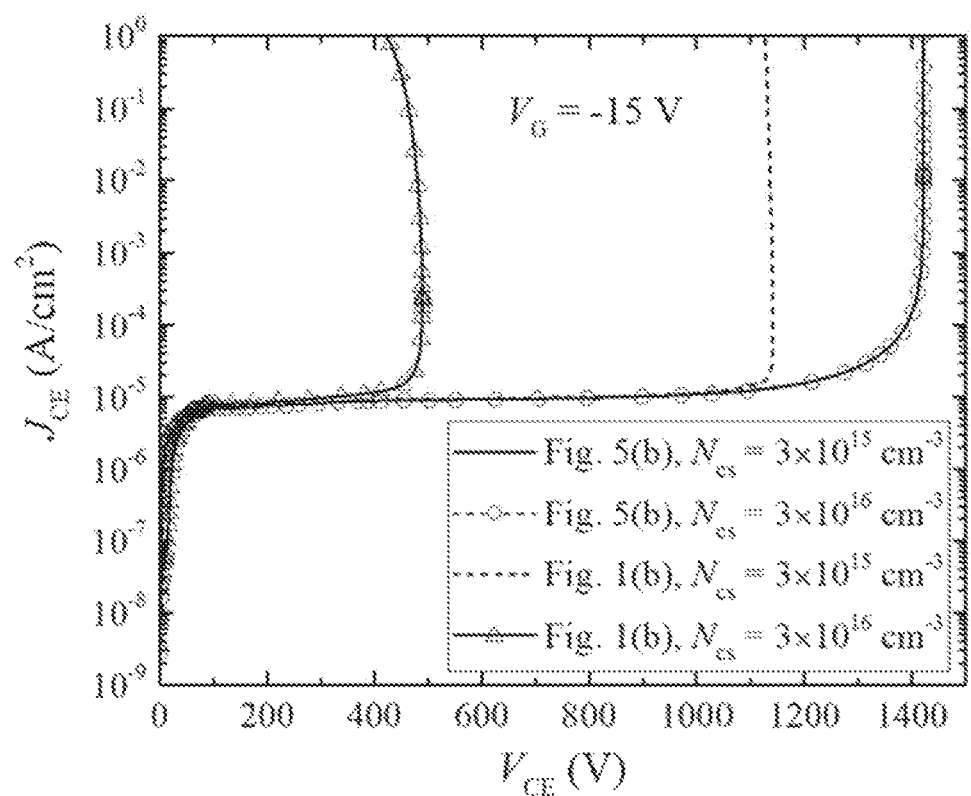
FIG. 19: The forward blocking I-V curves of the semi-superjunction IGBT of FIG. 5 (b) and the semi-superjunction IGBT of FIG. 1 (b)

FIG. 19 shows forward blocking I-V curves of structures of FIG. 5 (*b*) and FIG. 1 (*b*), wherein gate voltage $V_G$=−15V. When the $N_{CS}$ and the $N_{pillar}$ are the same, the breakdown voltage (1420V) of the structure of FIG. 5 (*b*) is higher than the breakdown voltage (1120V) of the structure of FIG. 1 (*b*); and when the $N_{CS}$ is increased to $3 \times 10^{16}$ cm$^{-3}$, the breakdown voltage of the structure of FIG. 5 (*b*) is not changed, and the breakdown voltage (490V) of the structure of FIG. 1 (*b*) is greatly reduced. This is mainly because that, when the $N_{CS}$ is increased, the electric field in the n-type carrier storage layer (n-cs layer 33) in the structure of FIG. 1 (*b*) increases, thereby reducing the breakdown voltage, while the trench gate structure (composed of 46 and 48) configured for providing a hole path in the structure of FIG. 5 (*b*) can help the n-type carrier storage layer (n-cs layer 33) to avoid suffering a high electric field so that the breakdown voltage remains unchanged.

Figure 20:
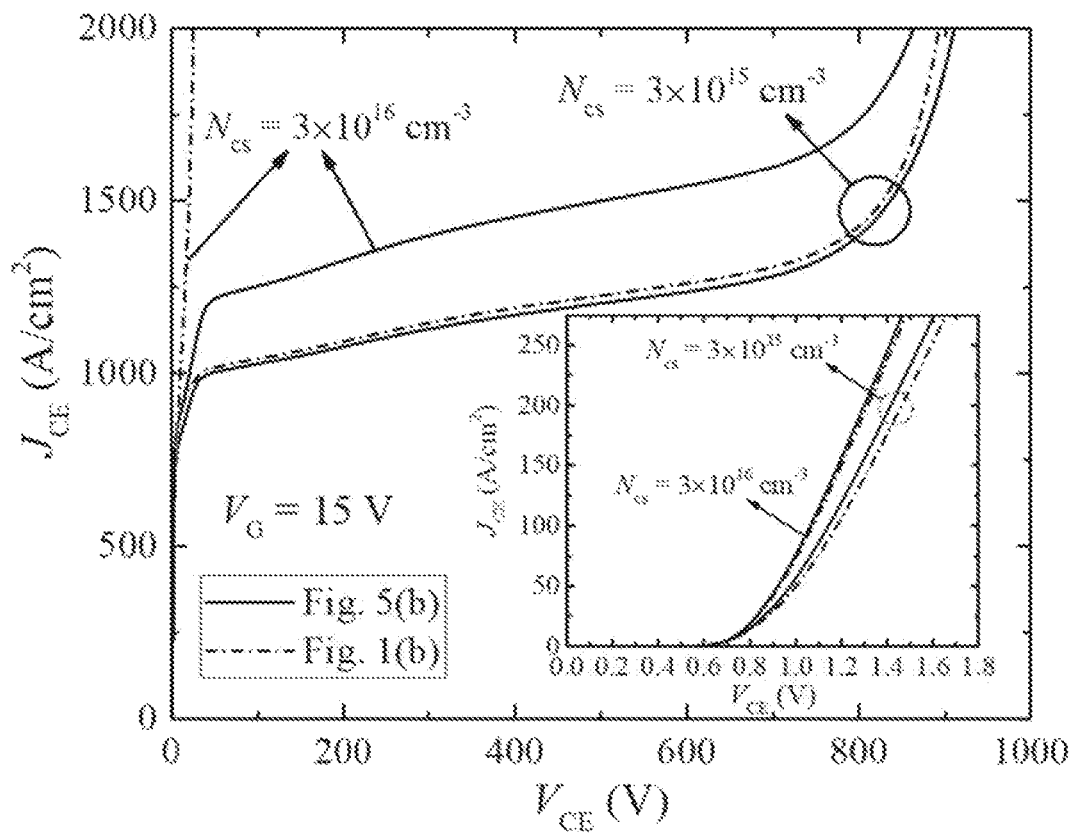
FIG. 20: The forward conduction I-V curves of the semi-superjunction IGBT of FIG. 5 (b) and the semi-superjunction IGBT of FIG. 1 (b).

FIG. 20 shows forward conduction I-V curves of the structure of FIG. 5 (*b*) and FIG. 1 (*b*), wherein the gate voltage $V_G$=15V. When the $N_{CS}$ and the $N_{pillar}$ are the same, the forward I-V curve of the structure of FIG. 5 (*b*) is nearly the same as FIG. 1 (*b*) (the conduction voltage drop is also nearly the same). When the $N_{CS}$ is increased to $3 \times 10^{16}$ cm$^{-3}$, the structure of FIG. 5 (*b*) still has current saturation capability, the saturation current is slightly increased and the conduction voltage drop is further reduced; However, the structure of FIG. 1 (*b*) loses current saturation capability. This is mainly because that, when the $N_{CS}$ is increased, holes can be further inhibited from entering into the emitter (E), thus, the conduction voltage drop is reduced. However, when the forward conduction voltage is slightly higher, since the hole path in the structure of FIG. 1 (*b*) is not fluent, the gate-drain shorted p-MISFET in the structure of FIG. 5 (*b*) is turned on and a fluent hole path is provided. Hence, the carrier storage effect in the body of the former is always strong and the carrier storage effect in the body of the latter starts to become weak. Therefore, the former cannot withstand voltage (current is difficult to saturate) and the latter can withstand voltage (current can saturate).

FIGS. 19 and 20 can illustrate that the semi-superjunction IGBT of the disclosure in FIG. 5 (*b*) is able to achieve a higher breakdown voltage and better current saturation characteristics than the p-pillar floating semi-superjunction IGBT in FIG. 1 (*b*) without sacrificing the on-state voltage drop. According to the characteristics of the structure of FIG. 5 (*b*), it can also be inferred that the structure of FIG. 5 (*b*) should also have a higher switching reliability than the structure of FIG. 1 (*b*).

According to the disclosure, a plurality of embodiments are provided, wherein the n-type semiconductor material may be regarded as a semiconductor material of a first conductivity type, and the p-type semiconductor material may be considered as a semiconductor material of a second conductivity type. Obviously, according to the principles of the disclosure, both the n-type and the p-type in the embodiment can be mutually exchanged without affecting the contents of the disclosure. Many other embodiments can be obtained by those skilled in the art without departing from the spirit of the disclosure.

What is claimed is:

1. A superjunction insulated gate bipolar transistor device, a cell structure of the device comprising: a voltage sustaining layer, a collector structure in contact with a bottom plane of the voltage sustaining layer, a base region of a second conductivity type in contact with a top plane of the voltage sustaining layer, a heavily doped emitter region of a first conductivity type in contact with at least a portion of the base region, a trench gate structure configured for controlling on and off in contact with the emitter region, the base region and the voltage sustaining layer, a collector formed by a conductor covering the collector structure, an emitter formed by a conductor covering the emitter region and the base region, a gate formed by a conductor covering the trench gate structure configured for controlling on and off, wherein:

the voltage sustaining layer is composed of at least one semiconductor region of the first conductivity type of the voltage sustaining layer and at least one semiconductor region of the second conductivity type of the voltage sustaining layer, the at least one semiconductor region of the first conductivity type of the voltage sustaining layer is in contact with the at least one semiconductor region of the second conductivity type of the voltage sustaining layer, and a contact surface formed by the at least one semiconductor region of the first conductivity type of the voltage sustaining layer and the at least one semiconductor region of the second conductivity type of the voltage sustaining layer is perpendicular or approximately perpendicular to the collector structure and the base region;

the voltage sustaining layer and the base region are not in direct contact, but are in indirect contact via a carrier storage layer of the first conductivity type;

the collector structure is composed of at least one collector region of the second conductivity type and at least one buffer region of the first conductivity type, the at least one buffer region of the first conductivity type is in contact with the voltage sustaining layer, and the at least one collector region of the second conductivity type is in direct contact with the collector;

the voltage sustaining layer is in direct contact with the at least one buffer region or is in indirect contact with the at least one buffer region via an assist layer of the first conductivity type;

the trench gate structure configured for controlling on and off includes at least one insulated dielectric layer of the trench gate structure configured for controlling on and off and at least one conductor region of the trench gate structure configured for controlling on and off; the at least one insulated dielectric layer of the trench gate structure configured for controlling on and off is in direct contact with the emitter region, the base region, the carrier storage layer, and the at least one semiconductor region of the first conductivity type of the voltage sustaining layer, or is in direct contact with the emitter region, the base region, the carrier storage layer, the at least one semiconductor region of the first conductivity type of the voltage sustaining layer, and the at least one semiconductor region of the second conductivity type of the voltage sustaining layer; the at least one conductor region of the trench gate structure configured for controlling on and off is in direct contact with the at least one insulated dielectric layer of the trench gate structure configured for controlling on and off, and is isolated from the emitter region, the base region, the carrier storage layer and the voltage sustaining layer by the at least one insulated dielectric layer of the trench gate structure configured for controlling on and off, and the at least one conductor region of the trench gate structure configured for controlling on and off is in direct contact with the gate;

the cell structure includes at least one first-type trench gate structure configured for providing a carrier path of the second conductivity type, or includes at least one first-type trench gate structure configured for providing a carrier path of the second conductivity type and at least one second-type trench gate structure configured for providing a carrier path of the second conductivity type and/or at least one third-type trench gate structure configured for providing a carrier path of the second conductivity type;

the at least one first-type trench gate structure includes at least one insulated dielectric layer of the at least one first-type trench gate structure and at least one conductor region of the at least one first-type trench gate structure, the at least one insulated dielectric layer of the at least one first-type trench gate structure is in direct contact with the base region, the carrier storage layer, and the at least one semiconductor region of the second conductivity type of the voltage sustaining layer, or is in direct contact with the base region, the carrier storage layer, the at least one semiconductor region of the second conductivity type of the voltage sustaining layer, and the at least one semiconductor region of the first conductivity type of the voltage sustaining layer; the at least one conductor region of the at least one first-type trench gate structure is in direct contact with the at least one insulated dielectric layer of the at least one first-type trench gate structure, and is isolated from the emitter region, the base region, the carrier storage layer and the voltage sustaining layer by the at least one insulated dielectric layer of the at least one first-type trench gate structure; the at least one conductor region of the at least one first-type trench gate structure is in direct contact with the emitter;

the at least one second-type trench gate structure includes at least one insulated dielectric layer of the at least one second-type trench gate structure and at least one conductor region of the at least one second-type trench gate structure, the at least one insulated dielectric layer of the at least one second-type trench gate structure is in direct contact with the base region, the carrier storage layer, and the at least one semiconductor region of the first conductivity type of the voltage sustaining layer; the at least one conductor region of the at least one second-type trench gate structure is in direct contact with the at least one insulated dielectric layer of the at least one second-type trench gate structure, and is isolated from the emitter region, the base region, the carrier storage layer and the voltage sustaining layer by the at least one insulated dielectric layer of the at least one second-type trench gate structure; the at least one conductor region of the at least one second-type trench gate structure is in direct contact with the emitter;

the at least one third-type trench gate structure includes at least one insulated dielectric layer of the at least one third-type trench gate structure and at least one conductor region of the at least one third-type trench gate structure, the at least one insulated dielectric layer of the at least one third-type trench gate structure is in direct contact with the base region, the carrier storage layer, and the at least one semiconductor region of the second conductivity type of the voltage sustaining layer and/or the at least one semiconductor region of the first conductivity type of the voltage sustaining layer; the at least one conductor region of the at least one third-type trench gate structure is in direct contact with the at least one insulated dielectric layer of the at least one third-type trench gate structure, and is isolated from the emitter region, the base region, the carrier storage layer and the voltage sustaining layer by the at least one insulated dielectric layer of the at least one third-type trench gate structure; the at least one conductor region of the at least one third-type trench gate structure is in direct contact with the gate;

the at least one conductor region of the trench gate structure configured for controlling on and off, the at least one conductor region of the at least one first-type trench gate structure, the at least one conductor region of the at least one second-type trench gate structure, and the at least one conductor region of the at least one third-type trench gate structure are composed of a heavily doped polycrystalline semiconductor material and/or other conductor materials;

at least one heavily doped region in the base region is in direct contact with the emitter to form an ohmic contact;

when the first conductivity type is n-type, the second conductivity type is p-type, and the carrier of the second conductivity type is a hole; and when the first conductivity type is p-type, the second conductivity type is n-type, and the carrier of the second conductivity type is an electron.

2. The superjunction insulated gate bipolar transistor device of claim 1, wherein:

the trench gate structure configured for controlling on and off, the at least one first-type trench gate structure, the at least one second-type trench gate structure, the at least one third-type trench gate structure, and the base region are arranged in a strip-shaped or hexagonal or circular or rectangular manner, and the at least one semiconductor region of the first conductivity type of the voltage sustaining layer and the at least one semiconductor region of the second conductivity type of the voltage sustaining layer are arranged in a strip-shaped or hexagonal or circular or rectangular manner; and the trench gate structure configured for controlling on and off, the at least one first-type trench gate structure, the at least one second-type trench gate structure, and the base region are arranged in the same or different arrangement manners as the at least one semiconductor region of the first conductivity type of the voltage sustaining layer and the at least one semiconductor region of the second conductivity type of the voltage sustaining layer.

3. The superjunction insulated gate bipolar transistor device of claim 1, wherein:

the base region is an interconnected base region or is divided into several mutually isolated base regions by the trench gate structure configured for controlling on and off, the at least one first-type trench gate structure, the at least one second-type trench gate structure, and the at least one third-type trench gate structure.

4. The superjunction insulated gate bipolar transistor device of claim 1, wherein:

a doping concentration of the carrier storage layer is higher than a doping concentration of the at least one semiconductor region of the first conductivity type of the voltage sustaining layer or equal to a doping concentration of the at least one semiconductor region of the first conductivity type of the voltage sustaining layer.

5. The superjunction insulated gate bipolar transistor device of claim 1, wherein:

a doping concentration of the assist layer is lower than a doping concentration of the at least one semiconductor region of the first conductivity type of the voltage sustaining layer, or is equal to a doping concentration of the at least one semiconductor region of the first conductivity type of the voltage sustaining layer, or is equal to a doping concentration of the at least one semiconductor region of the first conductivity type of the voltage sustaining layer and a doping concentration of the carrier storage layer.

6. The superjunction insulated gate bipolar transistor device of claim 1, wherein:

a doping concentration of the at least one buffer region is higher than a doping concentration of the assist layer, or is equal to a doping concentration of the assist layer, or is equal to a doping concentration of the assist layer and a doping concentration of the at least one semiconductor region of the first conductivity type of the voltage sustaining layer, or is equal to a doping concentration of the assist layer, a doping concentration of the at least one semiconductor region of the first conductivity type and a doping concentration of the carrier storage layer.

7. The superjunction insulated gate bipolar transistor device of claim 1, wherein:

at least one lightly doped semiconductor region of the first conductivity type is included in the at least one semiconductor region of the first conductivity type of the voltage sustaining layer; a bottom of the at least one semiconductor region of the second conductivity type of the voltage sustaining layer is surrounded by the at least one semiconductor region of the first conductivity type of the voltage sustaining layer;

the at least one lightly doped semiconductor region of the first conductivity type is in direct contact with the at least one buffer region or is in direct contact with the assist layer, the at least one lightly doped semiconductor region of the first conductivity type is further in direct contact with the carrier storage layer; the doping concentration of the at least one lightly doped semiconductor region of the first conductivity type is the same as the doping concentration of the assist layer.

8. The superjunction insulated gate bipolar transistor device of claim 1, wherein:

bottoms of the trench gate structure configured for controlling on and off, the at least one first-type trench gate structure, the at least one second-type trench gate structure, and the at least one third-type trench gate structure are surrounded by heavily doped semiconductor regions of the second conductivity type; and the heavily doped semiconductor regions of the second conductivity type are in direct contact with the voltage sustaining layer.

* * * * *